(12) United States Patent
Chang et al.

(10) Patent No.: US 6,322,953 B1
(45) Date of Patent: Nov. 27, 2001

(54) METHOD FOR OBTAINING UNIFORM PHOTORESIST COATINGS

(75) Inventors: Wen-Pin Chang; Wen-Wha Lu, both of Hsinchu (TW)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 09/277,369

(22) Filed: Mar. 29, 1999

(51) Int. Cl.$^7$ ........................................ G03F 7/00
(52) U.S. Cl. .................. 430/312; 430/315; 430/324; 430/326; 438/697
(58) Field of Search .................... 430/312, 315, 430/324, 326; 438/697

(56) References Cited

U.S. PATENT DOCUMENTS

| | | | |
|---|---|---|---|
| 3,873,313 | * | 3/1975 | Horst ........................... 96/36 |
| 4,464,458 | * | 8/1984 | Chow ........................... 430/312 |
| 4,591,547 | * | 5/1986 | Brownell ....................... 430/312 |
| 4,847,214 | * | 7/1989 | Robb ............................ 437/67 |
| 5,075,248 | * | 12/1991 | Yoon ........................... 437/52 |
| 5,077,234 | * | 12/1991 | Scoopo ......................... 437/67 |
| 5,111,259 | * | 5/1992 | Teng ............................ 357/23.6 |
| 5,139,918 | * | 8/1992 | Goel ............................ 430/166 |
| 5,175,122 | * | 12/1992 | Wang ........................... 437/67 |
| 5,266,813 | * | 11/1993 | Comfort ........................ 257/19 |
| 5,516,625 | * | 5/1996 | McNamara ....................... 430/314 |

* cited by examiner

Primary Examiner—Mark F. Huff
Assistant Examiner—Nicole Barreca
(74) Attorney, Agent, or Firm—Finnegan, Henderson, Farabow, Garrett & Dunner, L.L.P.

(57) ABSTRACT

A method of planarizing a photoresist coating for a semiconductor device having a plurality of trenches including providing a first layer of photoresist over the plurality of trenches wherein the layer has a thickness and the photoresist is a positive-type photoresist, exposing the first layer to light having a predetermined energy, developing the exposed first layer wherein a portion of the first layer remains within the plurality of trenches, and providing a second layer of photoresist over the developed first layer.

6 Claims, 2 Drawing Sheets

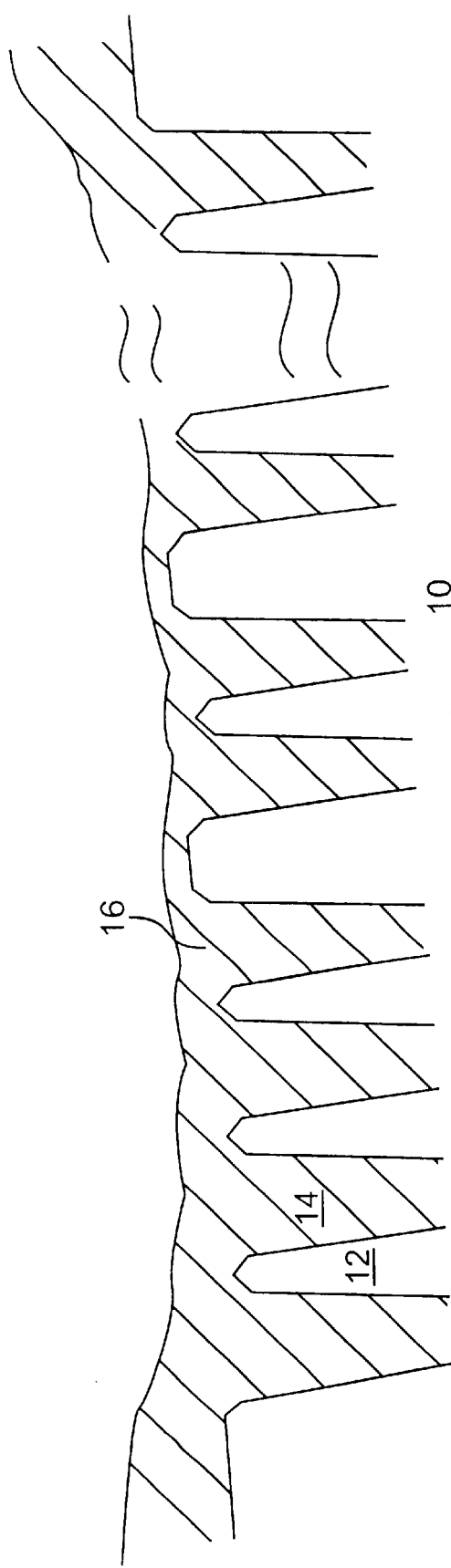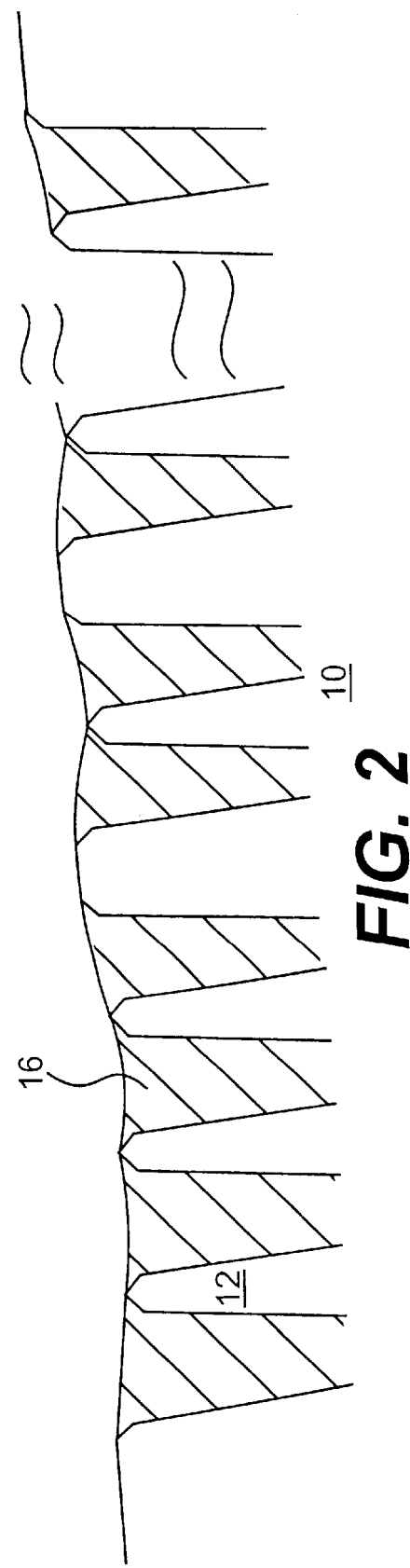

METHOD FOR OBTAINING UNIFORM PHOTORESIST COATINGS

BACKGROUND OF THE INVENTION

1. Field of the Invention

This invention pertains in general to a semiconductor manufacturing process and, more particularly, to a method for obtaining uniform photoresist coatings.

2. Description of the Related Art

Photoresist is a light-sensitive coating used during semiconductor device manufacturing processes, and is applied in liquid form. Typically, a small quantity of photoresist is applied to a wafer surface spun at high speed to spread the photoresist over the wafer surface. A pattern of light is then projected onto the photoresist. For a positive-type photoresist, regions exposed to the projected light may be removed by etchants, whereas regions not exposed to light are hardened and become resistant to etchants. In contrast, regions of a negative-type photoresist exposed to light become resistant to etchants. The steps of applying, exposing, and hardening of photoresist are essential in delineating patterns on the surface of a wafer in a semiconductor device manufacturing process.

During the manufacturing process, the wafer surface may acquire a complicated topography that include ridges and deep trenches. Trenches are often formed to isolate adjacent devices, prevent latch-ups in CMOS circuits, and provide capacitor components in high-density dynamic random-access memory cells ("DRAMs"). Because photoresist fills the trenches when it is applied over the wafer surface, the planarity of the coating referred to herein as uniformity, is difficult to obtain and, in some cases, leads to a dip in the photoresist layer above the trenches. For a DRAM manufacturing process, in particular, such a dip may lead to unacceptable variations in the formation of the device.

One method to minimize photoresist coating nonuniformity adds a second coating of photoresist over the first layer. Although the addition of a second layer may improve the uniformity of the coating surface, such an additional coating is insufficient when device size continues to shrink and the vertical features such as the trenches become comparable in size to horizontal features such as wiring.

SUMMARY OF THE INVENTION

Accordingly, the present invention is directed to a method for obtaining uniform photoresist coatings that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided a method for manufacturing a semiconductor device. The method includes providing a first layer of photoresist wherein the layer of photoresist has a thickness and is a positive type photoresist, exposing the first layer to light having a predetermined energy, developing the exposed first layer wherein a portion of the first layer remains, and providing a second layer of photoresist over the developed first layer.

In one aspect of the invention, providing a first layer of photoresist comprises providing an i-line photoresist layer having a thickness of approximately 3 um.

In another aspect of the invention, exposing the first layer to light having a predetermined energy comprises exposing the first layer to light having an energy of approximately 250 milli-Joules.

Also in accordance with the invention, there is provided a method of planarizing a photoresist coating for a semiconductor device having a surface including a trench. The method includes providing a first layer of photoresist over the surface including the trench wherein the layer has a thickness and the photoresist is a positive-type photoresist, exposing the first layer to light having a predetermined energy, developing the exposed first layer wherein a portion of the first layer remains within the trench, and providing a second layer of photoresist over the developed first layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings:

FIG. 1 shows a first layer of photoresist disposed over the surface of a wafer having a plurality of trenches;

FIG. 2 shows steps of exposing and developing the first layer of photoresist.

DETAILED DESCRIPTION OF THE PREFERRED EMBODIMENTS

Figure 3:
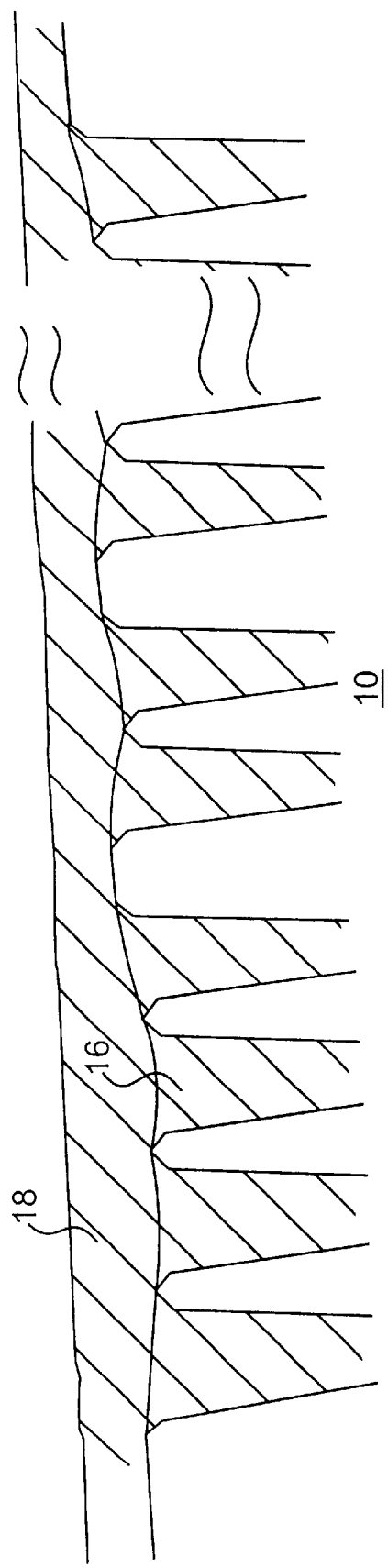
FIG. 3 shows a second layer of photoresist deposited over the exposed and developed first photoresist layer.

In accordance with the present invention, there is provided a method for providing uniform photoresist coatings. FIG. 1 shows a layer of photoresist disposed over a wafer surface. Referring to FIG. 1, a wafer 10 includes a plurality of ridges 12 and trenches 14. A first layer of photoresist 16 is deposited over the surface of wafer 10, and photoresist 16 fills trenches 14. FIG. 1 shows that the surface of photoresist 16 in the region over trenches 14 is nonplanar.

Referring to FIG. 2, the deposited first photoresist layer 16 is then exposed to light having a predetermined energy and developed to remove a portion of photoresist 16. Because photoresist 16 is developed, or etched, after it is exposed to light, the method of the present invention requires that photoresist 16 be a positive-type photoresist. In one embodiment, photoresist 16 comprises an I-line type resist, IX405EM, manufactured by Japan Synthesis Rubbers Co. In another embodiment, the thickness of the deposited first layer of photoresist 16 is approximately 3.0 $\mu$m. Referring to the embodiment wherein photoresist 16 is the IX405EM i-line type resist, and the deposited photoresist thickness is approximately 3.0 $\mu$m, the predetermined energy of the light is approximately 250 milli-Joules.

As shown in FIG. 2, by exposing photoresist 16 to a predetermined energy, substantially all of photoresist 16 may be developed and removed, except portions that fill trenches 14. In view of the above, a person skilled in the art would be able to readily ascertain such predetermined energy for other types of photoresist.

Referring to FIG. 3, a second layer of photoresist 18 is disposed over first photoresist layer 16 to obtain a substantially uniform, or planar, surface. Photoresist 18 may be either a positive-type or a negative-type photoresist. The substantially uniform photoresist 18 cannot be obtained without the exposed and developed photoresist layer 16.

Since photoresist 18 as deposited has a substantially uniform surface, it is possible to proceed with exposure of photoresist 18 to define with great accuracy features of the device being fabricated.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of planarizing a photoresist layer for a semiconductor device having a surface including a trench, comprising:

providing a first layer of photoresist over the surface including the trench, said first layer having a thickness and said first layer of photoresist being a positive photoresist;

exposing an entire surface of said first layer to light;

developing and removing said exposed first layer wherein a portion of said first layer remains within the trench; and providing a second layer of photoresist over said remaining portion of said developed first layer.

2. The method as claimed in claim 1 wherein providing a first layer of photoresist comprises providing an i-line photoresist layer having a thickness of approximately 3 $\mu$m.

3. The method as claimed in claim 2 wherein exposing said first layer to light comprises exposing said first layer to light having an energy of approximately 250 milli-Joules.

4. The method as claimed in claim 1 wherein said surface has a plurality of trenches and ridges, and said first layer is exposed on both the area over said trenches and ridges.

5. The method as claimed in claim 1 wherein said first photoresist layer is developed and removed to leave remaining portions of said first layer filling up the trench.

6. The method as claimed in claim 1 wherein said second layer provides a substantially planar top surface.

* * * * *